United States Patent [19]

Hammond

[11] Patent Number: 4,868,893

[45] Date of Patent: Sep. 19, 1989

[54] SYSTEM FOR REMOTE, INTERACTIVE COMMUNICATION WITH A METAL UNDER AMBIENT SUNLIGHT CONDITIONS

[75] Inventor: Scott H. Hammond, Tyler, Tex.

[73] Assignee: TransData, Inc., Tyler, Tex.

[21] Appl. No.: 192,845

[22] Filed: May 11, 1988

[51] Int. Cl.⁴ .............................................. H04B 9/00
[52] U.S. Cl. ................................ 455/617; 340/870.02; 340/870.28; 455/603; 455/608
[58] Field of Search ............... 455/603, 604, 606, 607, 455/608, 609, 615, 617–619; 370/3; 340/870.02, 870.03, 870.12, 870.18, 870.26, 870.28

[56] References Cited

U.S. PATENT DOCUMENTS

| | | | |
|---|---|---|---|
| 4,037,219 | 7/1977 | Lewis | 340/870.22 |
| 4,091,273 | 5/1978 | Fuller | 455/603 |
| 4,213,119 | 7/1980 | Ward et al. | 455/608 |
| 4,281,325 | 7/1981 | Jarva | 340/870.02 |
| 4,398,172 | 8/1983 | Carroll | 455/604 |
| 4,426,662 | 1/1989 | Skerlas | 455/619 |
| 4,641,374 | 2/1987 | Oyama | 455/603 |
| 4,646,084 | 2/1987 | Burrows | 340/870.03 |
| 4,680,704 | 7/1987 | Konicek | 340/870.02 |
| 4,684,248 | 8/1987 | Cinzori | 455/606 |

*Primary Examiner*—Robert L. Griffin
*Assistant Examiner*—Leslie Van Beek
*Attorney, Agent, or Firm*—Mueller and Smith

[57] ABSTRACT

Apparatus for transmitting meter data in serial form by IR emissions to a remote, hand-held communicator having a front-end detector circuit including a photodiode responding to the meter data and dissipating a d.c. term occasioned by indirect ambient illumination of the photodiode in the IR region. Corresponding control communication from the communicator to the meter is provided by IR emissions directed from an emitter of narrow beam angle to a wider angle receiving photodiode mounted with the meter at a location shielding it from direct sun illumination emanating above a horizontal plane extending from the immediate region of the photoresponsive receiver. Higher data transmission rate of 19.2 Kbaud are available in conjunction with an FSK transmission approach employing two channels.

27 Claims, 7 Drawing Sheets

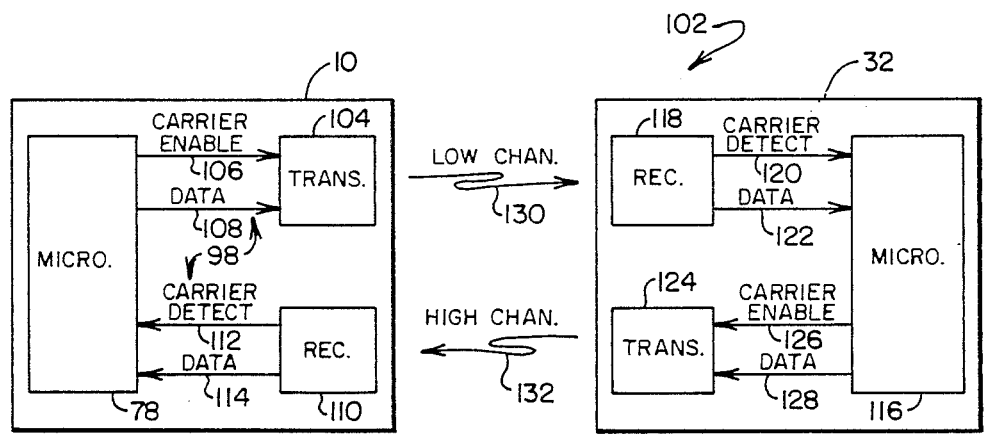
FIG. 5
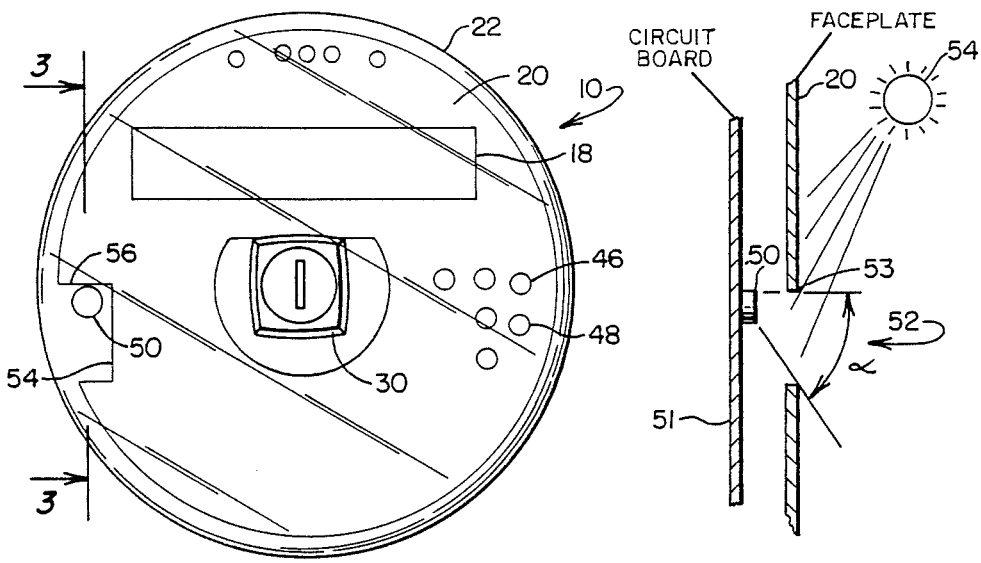
FIG. 2
FIG. 3A

SYSTEM FOR REMOTE, INTERACTIVE COMMUNICATION WITH A METAL UNDER AMBIENT SUNLIGHT CONDITIONS

BACKGROUND OF THE INVENTION

The utility industry traditionally has determined power consumption for billing purposes through the use of meters mounted at some accessible location at a customer facility. Watthour readings have been visually made and hand recorded by meter readers in appropriate ledgers. However, as technology has progressed, visual reading and hand recording of meter data have been supplanted, at least with respect to commercial customers, by automatic reading and recording devices. In their general configuration, these hand carried devices include solid-state memory and an associated microprocessor driven control which develops a communications protocol through input-output (I/O) devices associated with both the meter and reader device. One popular I/O approach employs an optical communications port wherein small infrared (IR) transmitter and receiving elements are mounted at the transparent meter face. Communication with these I/O devices is by a corresponding I/O device which is positioned and magnetically coupled to the meter face. This latter communications coupler is about a two pound component which is connected with the control unit by coiled flexible cable. Close physical association of the communications coupler with the meter communications port is necessitated in view of the ambient light interference which otherwise would be encountered with the typical outdoor mounting of meters. Because of the relatively heavy structure of the cord connected magnetic coupler, operators will drop them from time to time with attendant dirtying of optical components necessitating attendant maintenance requirements.

Over the recent past, electricity meters have been introduced to the marketplace having highly sophisticated electrical parameter measuring capabilities. Marketed, for example, under the trade designation "EMS-99" by TransData, Inc., the meters perform essentially in digital fashion and are capable of deriving a greatly expanded number of power parameter readouts, thus making a greatly heightened selection of power data available to the utility employing them. The metering devices also utilize an expanded control capability and, thus, are receptive to more elaborate programming instructions from the servicing utility. By comparison to earlier metering devices, the amount of data which are generated and would be transferred by conventional opto-coupling techniques is greatly expanded.

SUMMARY

The remote communications system and data transfer approach of the instant invention involves the transmission of information in binary form utilizing light or radiation in the infrared (IR) region of the spectrum. A communicating device held by the meter reader or operator is of convenient size and is capable of carrying out requisite communications both as to programming a meter, as well as receiving data concerning power parameters therefrom from somewhat remote locations, for example, distances up to about 20 feet. Because electricity and other meters typically are mounted outdoors in ambient light surroundings, it is necessary to avoid saturation of the photo-detecting components of the system occasioned by sunlight. This has been achieved with the the invention through a combination of signal treatment, select reception acceptance angles and transmission beam angles and the blocking of that sunlight which would otherwise directly, as opposed to indirectly impinge upon photodetectors which are employed with the meter component. The communications approach is particularly suited for use with high performance electricity meters as the above, and thus, further must exhibit a capability for transferring data at very high baud rates.

Another particular aspect of the invention provides apparatus for effecting communication between a meter having a control circuit providing meter data as output signals and a hand maneuverable communicator, the communicator being locatable within an environment of direct and indirect sun generated radiation. A meter transmitter arrangement is mounted with the meter for transmitting the metered data to the communicator which includes a modulator responsive to the output signals for deriving binary signals corresponding therewith exhibiting predetermined frequency and transmission rate. An emitter is responsive to the binary signal for effecting transmission thereof as signal emissions representing a predetermined frequency within a select region of the spectrum. A receiver is mounted with the communicator which includes a photoresponsive receiving device responsive to the impingement of the signal emissions thereon to derive a binary characterized output exhibiting the predetermined frequency and is further responsive to sun generated indirect radiation within the noted select region of the spectrum to derive a d.c. characterized output of level corresponding with the intensity thereof. A detector circuit is provided which is responsive with the photoresponsive receiver outputs for amplifying the binary characterized outputs while excluding the noted d.c. characterized output to provide an amplified binary characterized output exhibiting the predetermined frequency. The detector circuit includes an amplfication stage having an input coupled with the photoresponsive receiver and an output having a gain defining first feedback path coupled between the output and input for predetermined amplification of the binary characterized output exhibiting the predetermined frequency, the amplification stage also having a second feedback path coupled between its input and output and responsive substantially only to the generation of the d.c. characterized output for effecting the diversion thereof from the output. The receiver arrangement further includes a demodulator responsive to the amplified binary characterized output for deriving microprocessor compatible signals in correspondence therewith.

Another particular aspect of the invention provides apparatus for carrying out communication between a meter having a forwardly disposed faceplate and a meter control circuit responsive to control inputs, and a hand-maneuverable communicator having a communicator control circuit for providing meter control signals, the meter and communicator being locatable within an environment of direct and indirect sun generated radiation. The apparatus includes a communicator transmitter mounted with the communicator for transmitting the meter control signals which includes a modulator responsive to the meter control signals for deriving binary signals corresponding therewith exhibiting predetermined frequency and transmission rate. An emitter is provided which is responsive to the binary signal for effecting transmission thereof as signal emissions exhibiting a predetermined frequency within a select region of the spectrum. A receiver is mounted with the meter which includes a photoresponsive receiver responsive to the impingement of the signal emissions thereupon to derive a binary characterized output exhibiting the predetermined frequency and responsive to the sun generated indirect radiation within the select region of the spectrum to derive a d.c. characterized output of level corresponding with the intensity thereof. A blocking arrangement is positioned adjacent the photosensitive receiver for substantially restricting the direct access of the impinging radiation to radiation from sources located below a horizontal plane extending from the vicinity of the photoresponsive receiver. A detector circuit is provided which is responsive to the photoresponsive receiver outputs for amplifying the binary characterized output while excluding the d.c. characterized output to provide an amplified binary characterized output exhibiting the predetermined frequency and a demodulator responsive to the amplified binary characterized output for deriving meter control input.

Another particular aspect of the invention provides apparatus for carrying out communication between a meter having a forwardly disposed faceplate and a meter control circuit responsive to control inputs and further providing meter data as serial output signals, and a hand maneuverable communicator having a communicator control circuit for providing meter control signals and for recording received meter data, the meter and communicator being locatable within an environment of direct and indirect sun generated radiation. The combination includes a meter transmitter mounted with the meter for transmitting the meter data to the communicator at a predetermined data transmission rate which includes a meter modulator responsive to the serial output signals for deriving first binary frequency shift keyed signals corresponding therewith at first and second frequencies. An emitter is included which is responsive to the first binary frequency keyed signals for effecting transmission thereof as first signal emissions within a select region of the spectrum. A communicator transmitter is mounted with the communicator for transmitting the meter control signals at a predetermined data transmission rate which includes a communicator modulator responsive to the communicator control circuit provided meter control signals for deriving second binary frequency shift keyed signals corresponding therewith at third and fourth frequencies and a communicator emitter responds to the binary frequency shift key signal for effecting transmission thereof as second signal emissions within a select region of the spectrum.

A communicator receiver is mounted with the communicator and includes a communicator photoresponsive receiver responsive to the impingement of the first signal emissions to derive a first binary characterized output exhibiting the first and second frequencies and responsive to the sun generated indirect radiation within the select region of the spectrum to derive a first d.c. characterized output of level corresponding with the intensity thereof. A communicator detector circuit is provided which is responsive to the communicator photoresponsive receiver output for amplifying the first binary characterized output while excluding the first d.c. characterized output to provide a first amplified binary characterized output exhibiting the first and second frequencies and a communicator demodulator is responsive to the amplified first binary characterized output for deriving microprocessor compatible signals for effecting the recordation of data. A meter receiver is mounted with the meter which includes a meter photoresponsive receiver responsive to the impingement of the second signal emission to derive a second binary characterized output exhibiting the third and fourth frequencies and is responsive to the sun generated indirect radiation within the select region of the spectrum to derive a second d.c. characterized output of level corresponding with the intensity thereof. The meter photoresponsive receiver includes a photodiode mounted within the meter rearwardly of the forwardly disposed face plate, the face plate being configured having an opening aligned with the photodiode and shaped to substantially restrict the direct access of impinging radiation to radiation from sources located below a horizontal plane extending from the top most portion of the photodiode. A meter detector circuit responds to the meter photoresponsive receiver outputs for amplifying the second binary characterized output while excluding the second d.c. characterized output to provide a second amplified binary characterized output exhibiting the third and fourth frequencies and a meter demodulator responds to the second amplified binary characterized output for deriving the meter control inputs.

Other objects and features of the invention will, in part, be obvious and will, in part, appear hereinafter.

The invention, accordingly, comprises the apparatus possessing the construction, combination of elements, and arrangement of parts which are exemplified in the following detailed disclosure. For a fuller understanding of the nature and objects of the invention, reference should be had to the following detailed description taken in connection with the accompanying drawings.

BRIEF DESCRIPTION OF THE DRAWINGS

FIG. 2 is a front view of the meter shown in FIG. 1;

FIG. 3A is a partial sectional view taken through the plane 3—3 of FIG. 2;

FIG. 5 is a block schematic view of the communicating system of the invention;

DETAILED DESCRIPTION OF THE INVENTION

Figure 1:
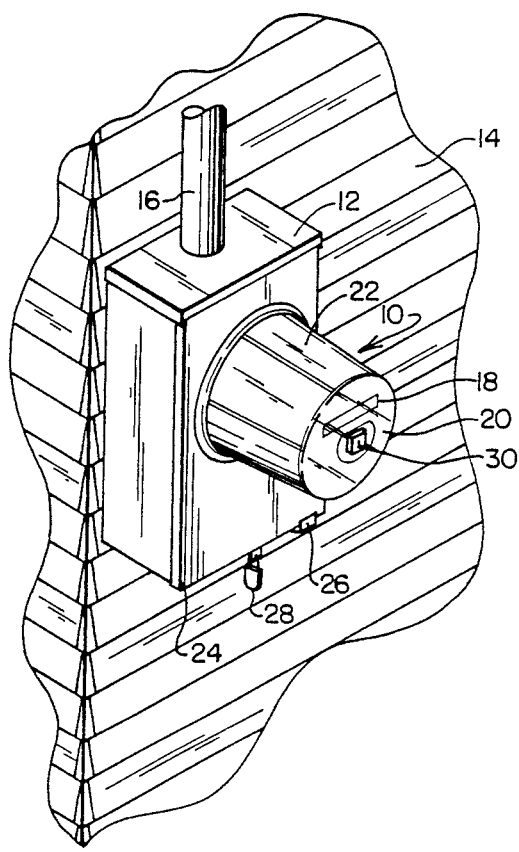
FIG. 1 is a pictorial partial view of the system of the invention showing a hand-held data collecting and transmitting device operating in conjunction with, but remotely from, an electricity meter.
Figure 1:
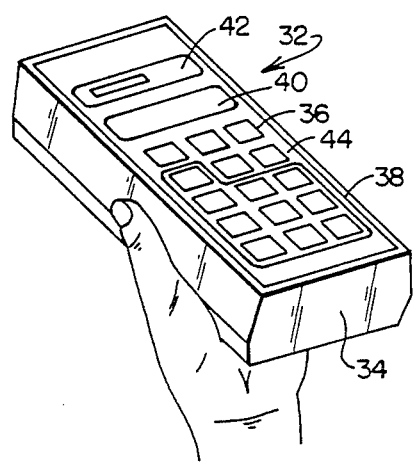

Looking to FIG. 1, an electricity meter is represented at 10 mounted within a conventional meter box or housing 12 mounted, in turn, upon a side of a building or the like represented at 14. The meter 10 receives its power related basic data from electrical conduiting as represented at 16 and provides an on-site display or readout 18. The readout 18 displays a considerable amount of information by use of scrolling techniques and is implemented, for example, by a liquid crystal display (LCD). Readout 18 is mounted within a forwardly disposed faceplate 20 which, along with the electrical components of the meter, are encased within a transparent frustoconical cover 22. Only the forward face 20 of the meter is visible, the remaining components thereof being shielded against sun radiation by a thin metallic shield (not shown) which further serves as a block to EMI and RFI noise impinging upon the meter, as well as any RFI effects generated by the solid-state circuit employed with the meter. Generally, the meter and cover 22 are retained upon the housing 12 by a removable front panel 24 which is retained in position by a latch 26 which, in turn, is sealed upon installation of the meter by, for example, a lead seal as at 28. To permit operator switching access into the meter 10 without distrubing the seal 28 and requiring removal of the cover 24, a key actuated switch 30 is provided. Switch 30, for example, may be employed for somewhat limited purposes to selectively control the scrolled readout of display 18. Generally, such assemblages as meter 10 and housing 12 are positioned at about eye level on building exteriors such that they may be facilely physically accessed by utility personnel.

Remote communication and data transfer with the meter 10 is carried out by a hand-held communicator or communicating and data transfer device 32. Device 32 includes a housing 34, the upwardly disposed base 36 of which supports a first grouping of keys 38 utilized for programming of device 32 to develop, for example, prompts as to which meters to read and the like. Such prompting is provided by an LCD display 40 which may, for example, be configured for display two rows of 16 dot matrix defining characters. A second LCD display is provided at 42 which is configured to show a bar graph of relative signal strength emanating from the meter 10. The latter device aids the operator in maneuvering the communicator 32 to a position for optimum reading of the IR signal developed at the face of meter 10. Device 32 further incorporates forwardly disposed photoresponsive detectors as well as IR transmitters. The second keyboard region of device 32 at 44 provides for operational control such as on and off, data entry, clearing and the like. Communicators such as at 32 are powered, for example, by rechargeable batteries and are loaded by computer inputs at the commencement of any given work period with data as to meter locations and identifications and the like and are then downloaded at the end of such work period into a computer receiving facility for entry into utility control and billing programs.

Figure 3B:
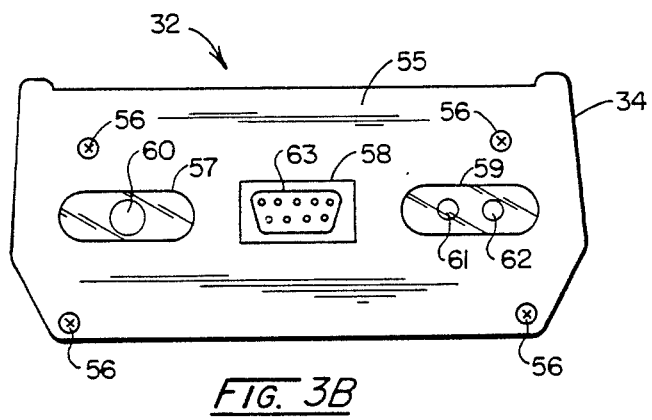
FIG. 3B is a front view of the hand-held communicator shown in FIG. 1.

Looking to FIG. 2, the forward portion of meter 10 is revealed including faceplate 20, cover 22, display 18, and switch 30. This forward face also includes two infrared emitting diodes 46 and 48 as well as a photodetector 50 which may, for example, be provided as a silicon photodiode. These devices are of a wide angle variety so as to enhance the success of communication with hand-held communicator 32. Photodiode 50 is mounted upon meter 10 in an arrangement wherein it is associated with a blocking function such that during normal working hours, i.e. 8:00 A.M. to 5:00 P.M. it cannot receive sunlight emanating directly from the sun. Looking additionally to FIG. 3A, the diode 50 is seen to be mounted upon a forwardly disposed vertical circuit board 51 of meter 10 at a location rearwardly of the faceplate 20. The latter plate 20 is cut away by a notch arrangement 52, the top of which at 53 is seen to be aligned with the top edge of photodiode 50. Thus configured, the wide acceptance angle of photodiode 50 is restricted such that it has direct access to impinging radiation from sources located below a horizonal plane extending from the top of diode 50. This acceptance angle is represented at $\alpha$ in FIG. 3A. The latter figure shows the blockage of direct rays of light from a symbolic representation of the sun source at 54. With the arrangement, a saturation of diode 50 with IR components of the radiation from sun source 54 is avoided, only reflective or indirect ambient radiation being impingeable upon the photodetecting device 50. While the latter indirect radiation will have an effect upon the output of photodiode 50, such effect will be seen to be accommodated for by the front end circuitry of the detecting arrangement.

Figure 3C:
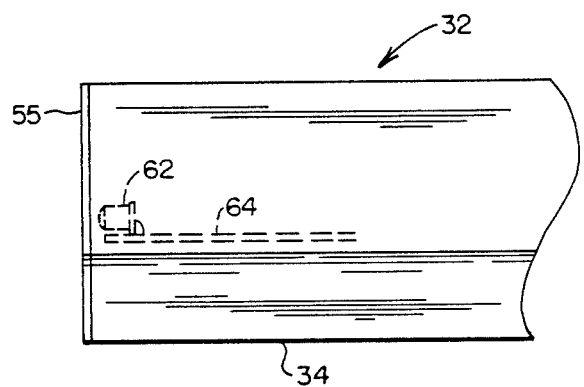
FIG. 3C is a partial side view of the hand-held communicator of FIG. 3B with portions shown in phantom to reveal internal structure.

In contrast to the wide beam angle of IR emitters 46 and 48 and the wide angle of acceptance of photodiode 50, the corresponding devices contained within communicator 32 are provided having narrow beam angles and angles of acceptance. Because the operator can maneuver device 32 and, in view of its narrow angle of acceptance, receiving photorespnsive diode saturation by direct sunlight can be avoided by such physical positioning and, thus, only a simple, preferably slightly recessed mounting is required. Further, the earlier noted bar graph readout 42 permits the operator to optimize received signal strength with such maneuvering of communicator 32. Similarly, because the operator has the capability of moving device 32 both horizontally and vertically, a narrow beam angle IR transmission becomes practical. Looking to FIG. 3B, the front face of communicator 32 is revealed as including an end plate 55 retained in position by screws 56. Plate 55 is shown having three elongate openings 57-59 therein. Openings 57 and 59 are covered with a protective clear window and positioned slightly behind window 57 is a narrow beam acceptance angle receiving diode 60. Similarly, behind window 59 are positioned narrow bean angle transmitting diodes 61 and 62. Located behind opening 58 is a multilead connector 63 which functions in conjunction with a matching connector provided within meter 10 such that, when the channel 24 and meter cover 22 are removed (FIG. 1) a direct cable connection may be made with the meter for data exchange. For such exchange, the IR transmitting and receiving circuits are turned off. Looking additionally to FIG. 3C, the simple mounting technique for these components is revealed in phantom. A circuit board is shown at 64 positioned within the housing 34 and the components as above discussed are mounted as represented by transmitting diode 62 at the end of the board so as to be positioned for communication through the window at opening 59.

Figure 4:
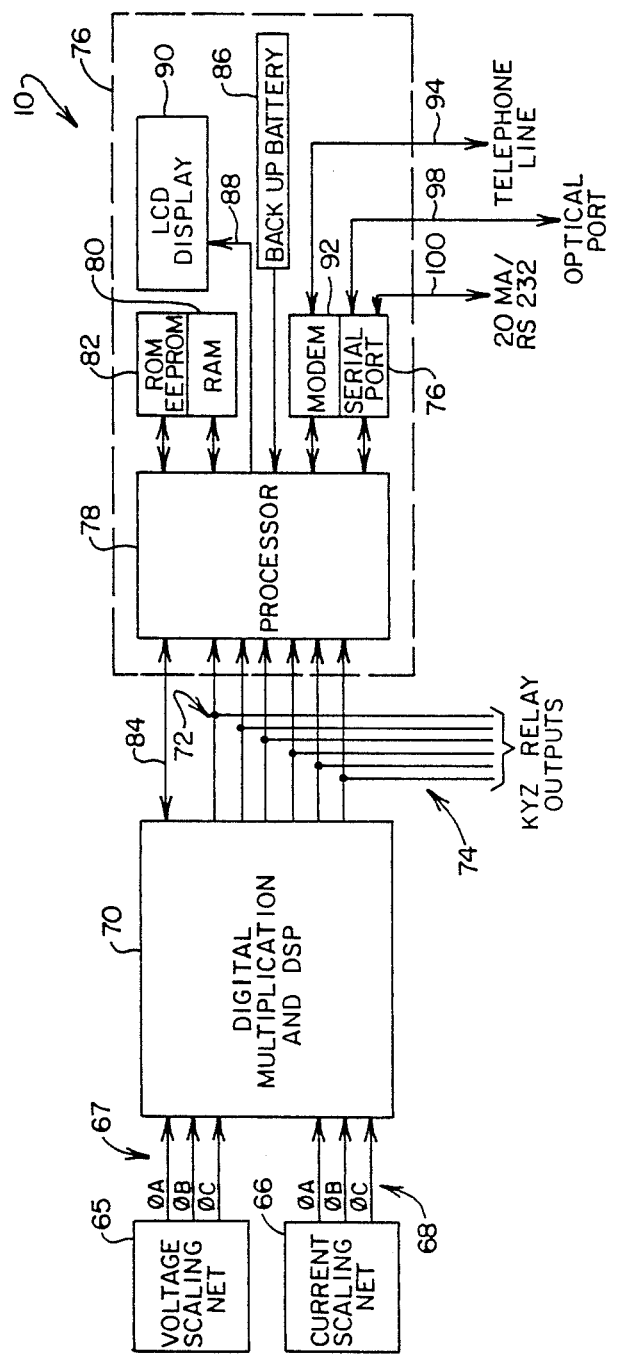
FIG. 4 is a block schematic diagram of the control system associated with the meter represented in FIG. 1.

Looking to FIG. 4, a general, block diagrammatic representation of the metering function for meter 10 is represented. The meter 10 is coupled typically to a polyphase line input and employs conventional step-down networks as represented at blocks 65 and 66 to provide respectively, voltage and current related inputs, for example, for three phases: A, B, and C. In the latter regard, the phase A-C voltage input signals are provided at three-line grouping 67 while voltage signals corresponding with a current developed by current transformers are provided at three-line grouping 68. Line groupings 66 and 68 are directed to the sampling input of a high speed digital control stage represented at block 70. This control stage 70 includes dual conversion components for range and data with respect to samples of the voltage and current inputs, as well as multiplication components. The stage further includes a processing network for treating the parameters derived for each sample and develops pulse outputs which can be employed for readouts and the like as are conventionally used in industry. To achieve the speeds required for the type of processing involved, a general purpose digital signal processor (DSP) may be employed.

Output for six selected electrical parameters which always will include watthours are provided by the latter processing function as represented by six-line grouping 72. The pulse carrying outputs at line grouping 72 are employed in typical fashion to provide KYZ relay outputs as represented at tapping line grouping 74 and also to provide the inputs to a microprocessor driven electronic register represented within dashed boundary 76. Register 76 is controlled from a conventional microprocessor represented at block 78, the input ports of which are coupled to receive line grouping 72. In conventional fashion, the microprocessor 78 operates in conjunction with random access memory (RAM) as represented at block 80 as well as in conjunction with a program contained in read only memory (ROM) as well as electronically eraseable programmable read only memory (EEPROM) as shown at block 82. The electronically eraseable read only memory as represented at block 82 functions to carry calibrating information which is submitted to the digital signal processor (DSP) function at block 70 at such time as the device 10 is powered up. This dual directional serial communication is represented by line 84. To maintain the data developed as outputs at array 72, a back-up battery is employed with the register 76 as represented at block 86 and line 88. The microprocessor 78 functions to treat the data received from line grouping 72 and provide a visual display, preferably through a liquid crystal (LCD) display 90 corresponding with earlier-described display 18 (FIGS. 1 and 2). To permit the device 10 to be programmed remotely, a modem as represented at block 92 is provided which functions to permit carrying out of programming and communication via a telephone link as represented at line 94. The on-site programming through an IR communications or optical link as described herein is provided through a serial port represented at block 96 and by line 98. Also, the port 96 may be employed for conventional serial communications as through an RS232 connection as represented by line 100. This communication, for example, may be carried out with connectors as described at 63 in FIG. 3B. The circuitry involved in conjunction with the diagram of FIG. 4 is described at enhanced levels of detail in an application for U.S. patent Ser. No. 042,306, entitled "Digital Power Metering" by Hammond et al., filed April 24, 1987.

Referring to FIG. 5, a system block diagram of the data transfer and communications system employed with the meter 10 and communicator 32 is shown in general at 102. The electricity meter 10 again is represented in block form as incorporating microprocessor 78 which functions to control communication channels for carrying out optical transmission and reception. In this regard, the transmission channel will include the earlier-described photodiodes 46 and 48 and their driving circuitry as now represented in FIG. 5 at block 104. Block 104 is seen to respond to a carrier enable input as represented at line 106 as well as a data transmission input represented at line 108. In similar fashion, the receiving function or channel incorporating photodiode 50 and supportive detection circuitry is represented at block 110 shown providing a carrier detect signal to the microprocessor function 78 as represented at line 112 and a serial data transfer function as represented at line 114 which carries microprocessor compatible control inputs.

The communications device is represented in FIG. 5 by block 32 as incorporating a microprocessor driven control represented at block 116 which performs in conjunction with a receiving function or channel incorporating a photodiode, associated detection circuit and demodulator as represented at block 118. This circuitry as represented at block 118 is essentially identical to that represented at block 110 with the exception that, in a preferred embodiment, a focused receiving photodiode having a narrower acceptance angle is employed. The receiving function 118 is seen to provide a carrier detect signal to the microprocessor function 116 as represented at line 120 and to provide for serial data transmission as microprocessor compatible signals to the control function at block 116 as represented by line 122.

In similar fashion, the transmission function including focused emitting diodes and drive circuitry is represented by block 124 and is seen to respond to a carrier enable signal as represented at line 126 emanating from the microprocessor driven control function 116 as well as a subsequent data stream emanating therefrom as represented at line 128. The latter data may, for example, carry out re-programming of the meter function 10 in terms of the parameters desired, demand condition alterations and the like.

Because of the extensive amount of data which the electricity meter 10 is capable of generating, the channels of communication between meter 10 and communicator 32 must be capable of transmission at a correspondingly high data rate. For the instant embodiment, a rate of 19.2 kilobits per second or 19.2 Kbaud is employed. With that data rate, under worst case considerations, the maximum data transfer interval will amount to about 15 or 20 seconds. Typically, however, the transmission will occur essentially instantaneously. The opto-electronic devices employed with the system preferably are of a highly efficient variety transmitting in the IR region or at about a wavelength centered at 875 nanometers. For example, devices 46 and 48 of the transmitting function 104 may be provided as GaAlAs hermetic infrared emitting diodes having a relatively wide beam angle of radiation for example, a beam angle of 50° between power points, such as type OP231W marketed by TRW Electronic Components Group of Carrollton, Texas. The corresponding receiving component of hand-held device 32 provided at function 118 may, for example, be selected as a PIN silicon photodiode having a relatively narrow acceptance angle of, for example, 10° measured from the optical axis to the half power point such as a type OP913 marketed by TRW Electronic Components Group (supra). The narrow angle of acceptance for the photoresponsive component of function 118 is selected to avoid direct sunlight saturation and improve signal-to-noise ratio for the receiving function, it being understood that the hand-held device can be maneuvered to an optimum position by the operator to take advantage of this focusing attribute of the photodetector.

The receiving function 110 of electricity meter 10 may incorporate a photoresponsive component as at 50 which is provided as a PIN silicon photodiode having a relatively wide radiation acceptance angle, for example, providing for a half angle of 30° measured from the optical axis to the half power point. For this purpose, a type OP913W as marketed by TRW Electronic Components Group (supra) may be employed. Correspondingly, the transmitting function 124 may employ an infrared emitting diode having a relatively narrow beam angle to enhance the signal to noise ratio of the receiving function 110 of meter 10. As before, this narrow beam angle may be employed inasmuch as the device 32 is hand manipulated by the operator and thus can be "aimed" at the receiving function 110 component 50. Exemplary of the emitting devices which may be employed is a GaAlAs hermetic infrared emitting diode type OP231 having a beam angle of 18° between half power points as marketed by TRW Components Group (supra).

The technique of communication between meter 10 and device 32 is one of frequency shift keying wherein two different frequencies are generated to represent corresponding binary values. In this regard, transmission from the meter 10 function 104 to the receiving function 118 of communicator 32 is in a first, low channel as represented at arrow 130. This low channel is so designated because the frequency components selected are the lower of those performing in the communications approach. For instance, the lowest of the two frequencies for this low channel 130 must be higher than the above-noted data rate and thus, a low and high frequency combination is selected, for example, of 24 KHz and 40 KHz performing at a 50% duty cycle.

Transmission frequencies are selected representing a "high" channel for transmitting from transmission function 124 of communicator 32 to the meter receiving function 110 as represented by arrow 132. The transmission frequencies for this channel are selected of values sufficiently spaced from the frequencies employed with the lower channels 130 so as to avoid any cross-talk phenomenon between the receiving and transmitting functions of either meter 10 or device 32 and to provide an advantageous capability for a duplex form of operation wherein the high and low channels 130 and 132 are operated simultaneously. Preferably, the shift frequencies selected for the high channel 132 are 90 KHz and 150 KHz operating in conjunction with a 25% duty cycle. The latter duty cycle is selected inasmuch as the transmission function 124 necessarily is associated with a battery power supply. By electing such a lower duty cycle, the amount of energy expended in transmission is minimized to, in turn, maximize battery working timespans. In effect, the hand-held communicator 32 utilizes one-half of the power employed by the meter 10 in transmission.

Figure 6:
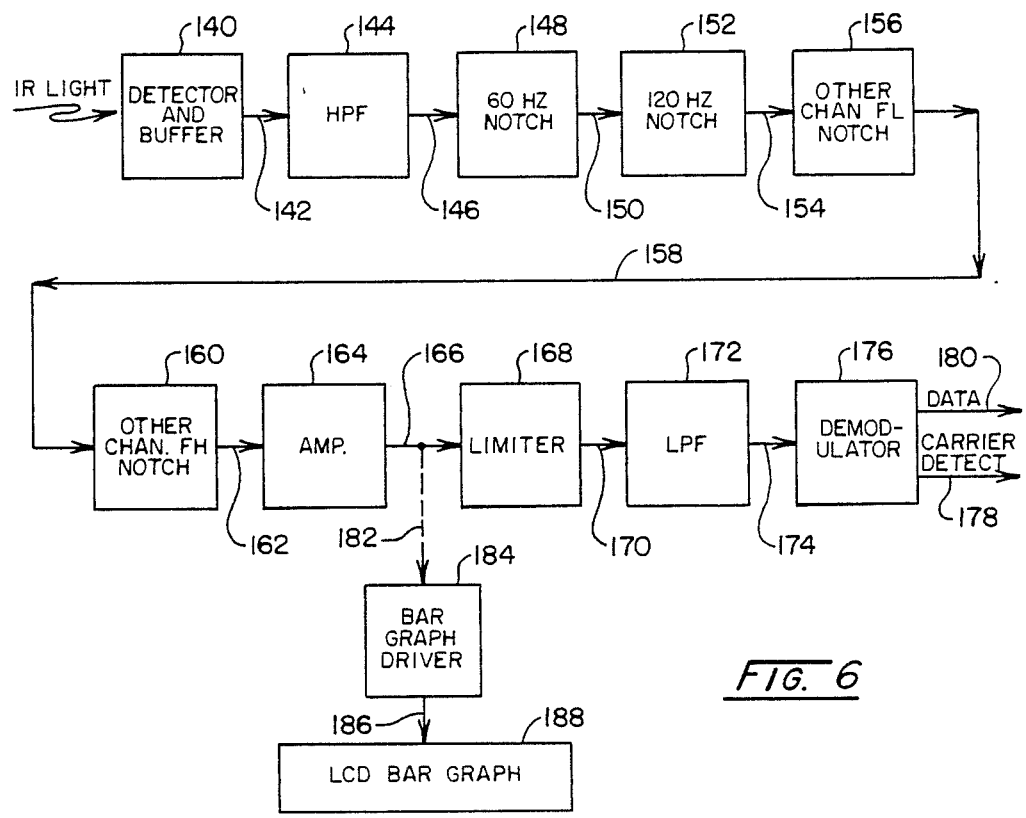
FIG. 6 is a block diagram of the receiving functions associated with the system of FIG. 5.

Referring to FIG. 6, a block diagrammatic representation of the receiving functions represented at blocks 110 and 118 in FIG. 5 is provided. These latter functions employ essentially the same circuitry but in conjunction with the noted focused and wide angle photodiodes. The photodiodes will be seen to be configured to be operated in a photovoltaic mode and receive light in the noted IR region transmitted from either transmitting functions 104, 124. Additionally, the devices receive ambient or indirect light typically generated from reflected radiation of sun and the resultant outputs are submitted to a detector and buffer stage represented at block 140. Stage 140 functions to both amplify the responding photovoltaic signal representing transmitted binary information and to dissipate those signals received which are generated by the indirect light of the ambient surround. In this regard, the corresponding IR component of ambient or indirect light is essentially a d.c. characterzied output or term which is removed from the signal. To operate the photodiode in the noted photovoltaic mode, a voltage bias also is applied at the stage 140 and the combined signal of the noted bias and the a.c. term representing binary data is submitted as represented at line 142 to a high pass filter stage represented at block 144. Stage 144 functions to remove the noted applied bias and, the signal then is treated as at line 146 and block 148 to remove any 60 Hz signals which will represent IR region noise generated from incandescent lights. Stage 144 generally is provided as a notch filter and is particularly useful when the receiving function is undergoing testing or the like within an indoor environment. The thus-filtered signal then is directed as represented at line 150 to a 120 Hz notch filtering stage as represented at block 152. Stage 152 functions in similar fashion as stage 148, removing any IR region signal interference generated by fluorescent lighting or the like. The signal then is treated as represented at line 154 and block 156 where notch filtering is carried out with respect to the lower frequency of the opposite channel of the system. The signal treatment then continues as represented at line 158 and block 160 to filter the corresponding higher frequency of the opposite channel of the system and, as represented at line 162 and block 164, the filtered binary signal then is amplified and as represented at line 166 and block 168, a limiting function is imposed upon the amplified binary signal for the purpose of controlling its amplitude with respect to the requirements of a later stage demodulator. As represented at line 170 and block 172, the thus-limited signal then is treated by a low-pass filter stage to remove any high frequency noise which may be occasioned from the operations of the preceding stages whereupon, as represented at line 174 and block 176 the dual frequencies of the binary signal are demodulated to provide a carrier detect signal as represented at line 178 for microprocessor driven control and the binary data are submitted in serial fashion to that control as represented at line 180.

As described in conjunction with FIG. 1, the handheld communicator 32 includes a signal strength readout 42 present as a bar graph which aids the meter reading personnel in pointing or aiming the narrow beam angle receiving photodiode toward the transmitted IR data signals. This feature is shown implemented in FIG. 6 by dashed line 82 leading to block 184 representing a bar graph driver. It may be observed that the signal asserted to the bar graph driver 184 is the filtered and amplified data signal utilized prior to its submittal to the limiter function 168. Driver 184 may be provided, for example, as a type LM3916 marketed by National SemiConductor Corp. As represented at line 186 and block 188, the bar graph driver 184 functions to activate a conventional liquid crystal display which may be provided as a type 2020 marketed by UCE Inc.

Figure 7:
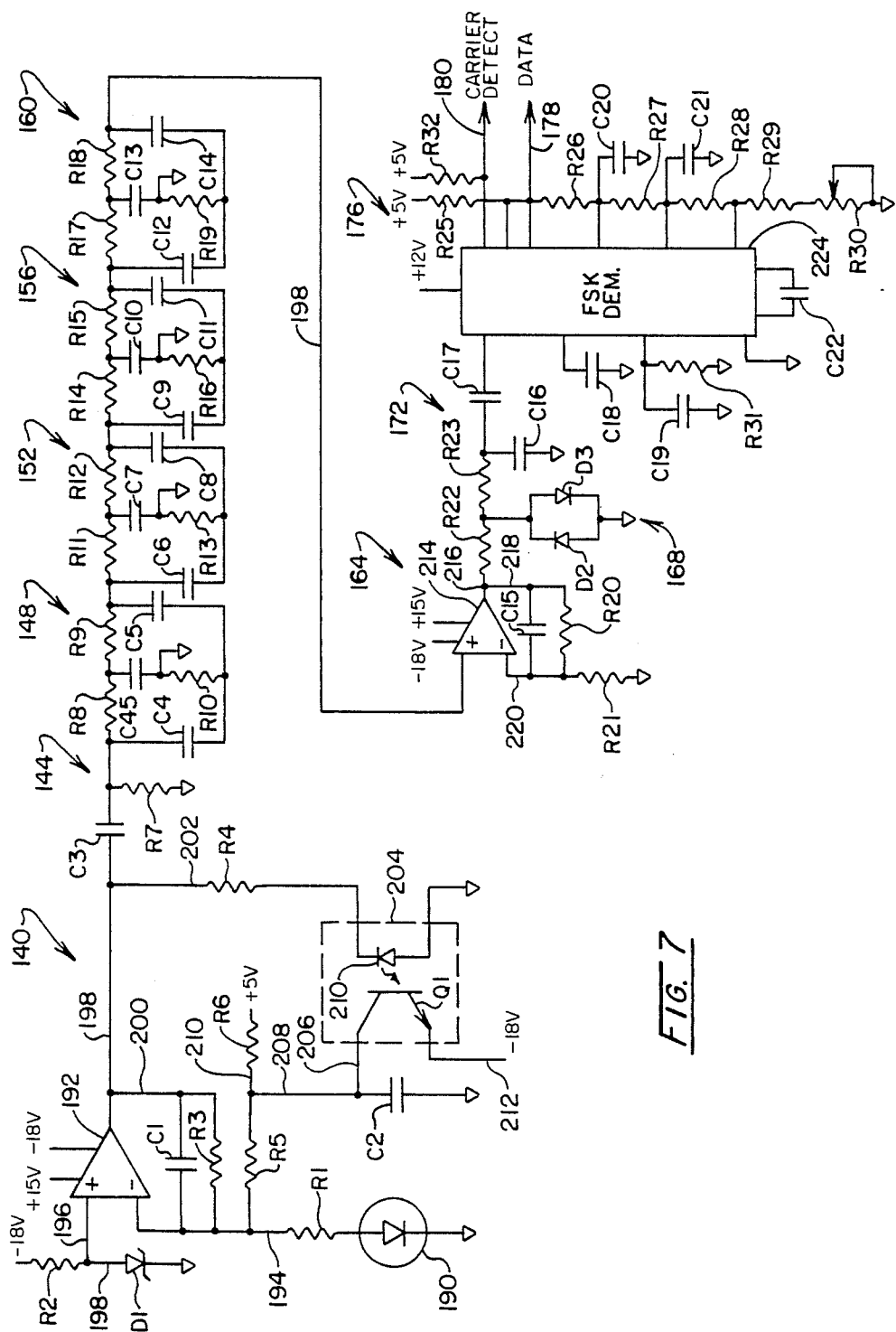
FIG. 7 is a schematic circuit diagram of the receiving circuit of FIG. 6.

Referring to FIG. 7, the components comprising the receiving function described in conjunction with FIG. 6 are revealed at an enhanced level of detail. In the figure, the detector and buffer function 140 is shown to include a PIN silicon photodiode 190 coupled between ground and the inverting input of an operational amplifier 192 by line 194 incorporating resistor R1. Provided, for example, as a type OP37 marketed by Precision Monolithic, Inc., the non-inverting input of amplifier 192 receives a −5 v constant input via line 196. Line 196, in turn, is coupled to line 198 incorporating resistor R2 and Zener diode D1 and connected between −18 v supply and ground. The resultant −5 v is seen at the output of amplifier 192 at line 198 and, additionally, appears at the inverting terminal of the amplifier 192 and thus line 194 and receiving diode 190. The bias thus asserted permits operation of diode 190 at its most efficient light energy transfer ratio.

Amplifer 192, in effect, incorporates two feedback paths. One path, represented by line 200, resistor R3 and line 194 provides a gain for the light responsive signals generated by diode 190. A capacitor C1 intermediate lines 200 and 194 is provided having a small capacitance value and functions to assert a minor amount of compensation called for to stabilize the performance of amplification stage 192. Generally, a gain of about 187 is developed with this initial feedback path.

A second feedback path also is provided which is defined by line 202 extending from line 198, resistor R4, an opto-isolator represented within dashed boundary 204, line 206, 208 and 210, resistor R5 and line 194. This arrangement is a unity gain d.c. feedback route which serves to compensate for the broad band effect of indirect ambient light which is manifested as a d.c. characterized output or term, the level of which varies in accordance with the level of background brightness experienced by receiving diode 190. The opto-isolator 204 may, for example, be provided as a type MOC8050 marketed by Motorola, Inc. and is selected for its generally slow response such that it is reactive to cancel the indirect light generated d.c. term or broad band signal which otherwise may saturate diode 190, while remaining unresponsive to the a.c. term generated by the transmitting IR devices simultaneously responded to by diode 190. In effect, the device 204 evolves a form of automatic gain control (AGC). Device 204 is shown schematically to include a light emitting diode 210 coupled within line 202 between resistor R4 and ground which functions to activate a photo-transistor represented schematically at Q1 having a collector coupled to line 206 and an emitter coupled via line 212 to −18 v. Capacitor C2, coupled within line 208 to ground, functions to filter any a.c. signal out of the second feedback loop to assure that no compensation is made for that term. A resistor R6 within line 210 is seen coupled to +5 v supply and functions as a bias to assure that the circuit is continually activated even though no light energy may be present.

With the detector and buffer arrangement 140 as thus shown mounted with meter 10 in combination with the noted shielding of the receiving diode as described at 50 in FIGS. 2 and 3, an effective technique for transmitting IR generated light signals from communicator 32 over convenient distances up to, for example, 20 feet is achieved. Avoidance of saturation of the light receiving diode monitored with meter 10 to direct sunlight as well as diversion of signals represents indirect lower intensity ambient or reflective forms of light permits the signal-to-noise (S/N) ratio of the system to remain at advantageously effective levels. As noted above, the same detector and buffer 140 approach is employed with communicator 32, however, because of its maneuverability only simple photodiode shielding is required in conjunction with a more narrow angle of radiation acceptance for the diode.

The output of the detector and buffer stage 140 and line 198, carrying the a.c. binary signal as well as the earlier-noted −5 v constant voltage, initially is submitted to a high pass filter stage 144 comprised of capacitor C3 and resistor R7. This filter stage 144 strips off the noted −5 v component of the signal. The resultant signal then is directed through a notch filter stage represented generally at 148 and comprised of resistors R8–R10 and capacitors C4, C40 and C5. Notch filter 148 removes any 60 Hz signals which may be present and which may be considered to occur unnaturally in the environment of the receiving diode. This type of noise may be encountered, for example, in an indoor environment for the meter as may be witnessed, for example, during maintenance procedures and the like. Upon being filtered at stage 148, the signal then is filtered at notch filter stage 152 comprised of resistors R11–R13 and capacitors C6–C8. Stage 152 filters 120 Hz signals as may be encountered, for example, from fluorescent lighting. From stage 152, the output signal then is filtered at notch filter 156 comprised of resistors R14–R16 and capacitors C9–C11. Stage 156 functions as a notch filter tuned to filter out the lower frequency of the oppositely transmitting channel of whichever device 10 or 32 is involved. In similar fashion, stage 160 comprised of resistors R17–R19 and capacitors C12–C14 functions to filter the transmitting frequency of the associated transmitting channel. The resultant filtered binary signal then continues as represented at line 198 to be directed to the non-inverting input of an operational amplifier 214 within amplification stage 164. The output of amplifier 214 at line 216 is coupled with a gain establishing feedback path including line 218 and resistors R20 and R21 extending line 220 and the inverting input of the amplifier. A capacitor C15 coupled between lines 218 and 220 provides for stabilization. The resultant amplified signal from stage 164 may be directed to the earlier-noted bar graph driver 184 and signal level indicating bar graph 188 as described above in connection with FIG. 6. Where that feature is not included, as where the circuit is employed with the meter 10, then the output is directly submitted to a limiter stage comprised of resistor R22 and diodes D2 and D3. Stage 168 limits the signal level past resistor R22 to, for example, ±700 millivolts to protect a subsequent demodulation stage. The signal then is directed to a low pass filter 172 comprised of resistor R23 and capacitor C16 which functions to strip any high frequency noise which might have been occasioned by the operation of the preceding stages of the circuit, particularly the operational amplifiers 192 and 214. This stage also performs a slight rounding function of the squarewave signal which may have been developed at the limiter stage 168. Upon passing filter stage 172, the signal encounters capacitor C17 which functions to strip off any d.c. value which may be associated with the signal through all of the foregoing stages. Accordingly, the capacitor functions in the manner of a high pass filter. The thus-treated signal then is asserted at the input terminal of an FSK demodulator/tone decoder 224. Provided, for example, as a type XR-2211 marketed by Exar, Inc., the device is calibrated by the resistor chain including resistors R25–R30, resistor R31, and capacitors C18–C22. Calibrating adjustment may be provided by the potentiometer configuration for resistor function R30. Upon witnessing either of the transmitted frequencies of interest, the demodulator 224 provides output representing a carrier detect signal as earlier-described in conjunction with FIG. 6 and again identified as line 180. Additionally, serial data are outputted at the data output of the device again represented at line 178. A pull-up resistor R32 coupled with +5 v is seen coupled to carrier detect line 180. The signals as at lines 178 and 180 are directed to an appropriate microprocessor driven control either for meter 10 as described in FIG. 5 at 78, or for hand-held communicator 32 as described at block 116 in the latter figure.

FIG. 5 reveals that the transmitting functions as at 104 in the case of meter 10 or 118 in the case of hand-held device 32 respond to a carrier enable output and a serial data output from an associated microprocessor driven control. Looking to FIG. 8, the block diagrammatic illustration of the transmission function is revealed. In the figure, the serial data input is shown introduced at line 226, while the carrier enable line is represented as being asserted at line 228 to a modulator 230. Modulator 230 responds to the carrier enable signal at line 228 to transmit data which will be asserted from line 226 and provide the frequency shift keying output corresponding with the data at line 232. In the case of higher channel frequencies as represented at arrow 132 in FIG. 5, providing, for example, a 25% duty cycle, a duty cycle converter function is carried out as represented by block 234. The converter may, for example, be a one-shot astable multi-vibrator such as type 74HZ4538 marketed Motorola, Inc. The resultant treated signal then is provided as represented at line 236 to the input of an IR driver and emitter represented at block 238 which functions to generate appropriate IR emission signals as represented by arrow 240.

Figure 9:
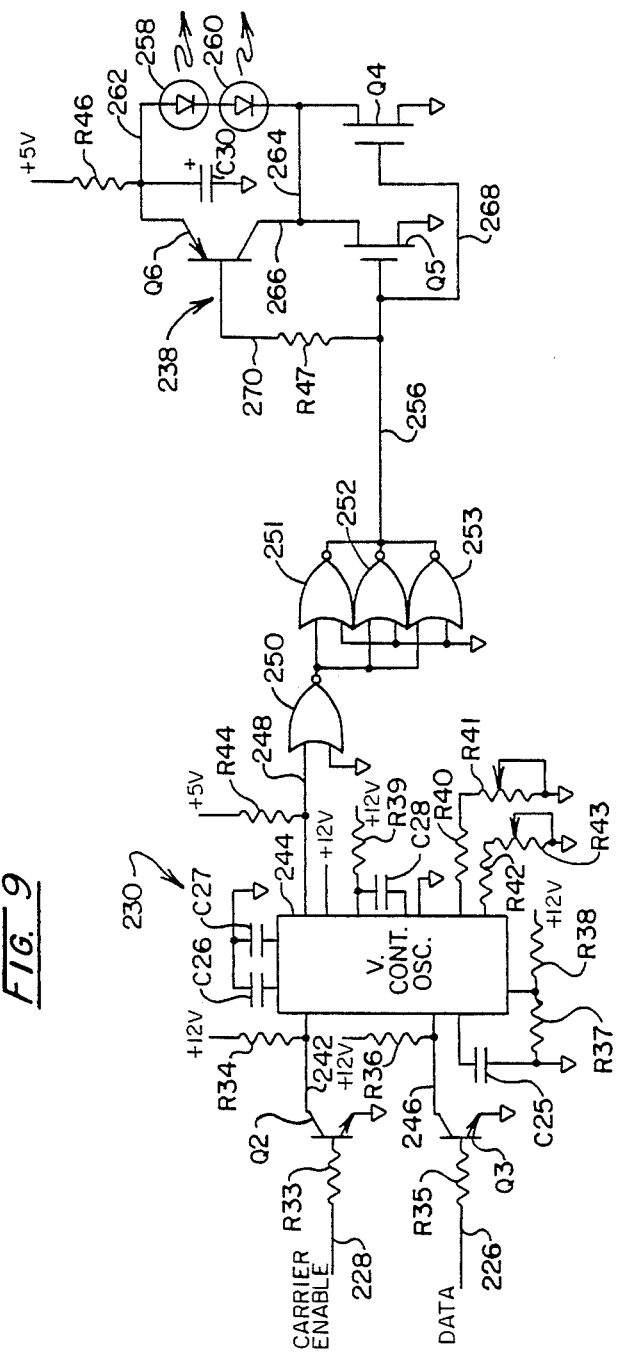
FIG. 9 is a schematic circuit diagram of the transmission function represented in FIG. 8.

Referring to FIG. 9, a detailed representation of the transmitting function without the presence of the noted duty cycle converter 234 is provided. In the figure, the carrier enable line again is represented at 228 as incorporating a bias resistor R33 and being directed to the base of NPN transistor Q2. The emitter of transistor Q2 is coupled to ground, while the collector thereof is coupled via line 242 to the enabling input of a voltage-controlled oscillator 244 of the modulator stage 230. Line 242 is coupled through pull-up resistor R34 to +12 v supply and the transistor Q2 performs a level shifting function to shift the voltage of the carrier enable signl to a higher level as required by the device 244. The latter device may be provided, for example, as a type XR-2207 marketed by Exar, Inc.

Figure 8:
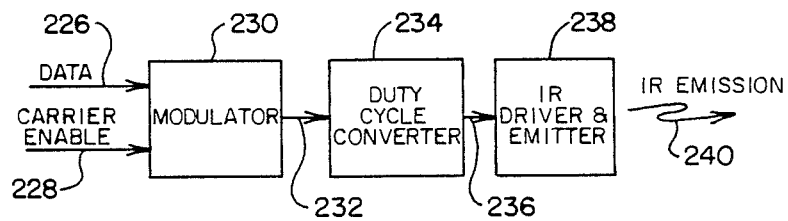
FIG. 8 is a block diagram of a transmission function of the system of FIG. 5.

In similar fashion, serial data are presented along line 226 as reproduced from FIG. 8 through bias resistor R35 to the base of NPN transistor Q3. The emitter of transistor Q3 is coupled to ground and the collector thereof is coupled via line 246 to the serial data in port of the oscillator stage 244. As before, line 246 is coupled through pull-up resistor R36 to +12 v and transistor Q3 performs the noted level shifting function to elevate the voltage value of the impressed data signals. Oscillator 244 is configured for the desired frequency bandwidth an the like by associated capacitors C25-C28 and resistors R37-R43. Of the latter, resistors R41 and R43 are provided in the form of potentiometers for calibration and tuning purposes. The signal output of the oscillator 244 is provided as a corresponding squarewave at line 248 which is seen to be coupled through pull-up resistor R44 to +5 v and is directed to one input of a combination of NOR gates 250-253 which are intercoupled to convert the medium level of impedance signal at the output of oscillator 244 to a very low impedance signal which is sent from more remotely located circuits within either meter 10 or hand-held device 32 to the forwardly disposed emitting components. The output of NOR gate bank 250-253 at line 256 is directed to the IR driver and emitter stage represented in general at 238 which is located forwardly within the device containing the circuit. For example, the stage 238 is located at forward circuit board 52 as described in conjunction with FIG. 3 in the case of meter 10. Stage 238 is seen to incorporate two diodes emitting radiation in the IR region as at 258 and 260 which are connected in series within line 262 which extends to one terminal of field effect transistor (FET) Q4, the opposite terminal of which is coupled to ground and, simultaneously via lines 264 to a corresponding terminal of FET transistor Q5, the opposite terminal of which is coupled to ground. The gate of transistor Q5 is coupled to receive the drive signal at line 256, while, simultaneously, the gate of transistor Q4 receives the same signal via line 268. A filter comprised of capacitor C30 and resistor R46 coupled between +5 v and ground is seen coupled to line 262 and a PNP transistor Q6 is provided having its base coupled to signal line 256 through line 270 and resistor R47. The emitter of transistor Q6 is coupled to line 262, while the collector thereof is coupled to lines 266 and 264, the device functioning to aid the turn-off performance of diodes 258 and 260.

Two diodes are employed with the instant device to improve the emitting characteristics of stage 238 and to accommodate the 5 v supply provided for stage 258. As noted earlier herein, for the hand-held device 32, the diodes are selected having a focused or narrow beam angle output, while when employed with the meter 10 as shown at 46 and 48 in FIG. 2, then a wider beam angle is employed.

Since certain changes may be made in the above system and apparatus without departing from the scope of the invention herein involved, it is intended that all matter contained in the above description or shown in the accompanying drawings shall be interpreted as illustrative and not in a limiting sense.

I claim:

1. Apparatus for effecting communication between a meter having a control circuit providing meter data as output signals, and a hand maneuverable communicator, said meter and communicator being locatable within an environment of direct and indirect sun generated radiation, comprising:
   meter transmiter means mounted with said meter, responsive to said control circuit for transmitting said meter data to said communicator, including:
   modulator means responsive to said control circuit output signals for deriving binary signals corresponding therewith exhibiting predetermined frequency and transmission rate,
   emitter means responsive to said binary signals for effecting transmission thereof as signal emissions within a select region of the spectrum and exhibiting said predetermined frequency; and
   receiver means mounted with said communicator, including:
   photoresponsive receiving means responsive to the impingement of said signal emissions thereupon to derive a binary characterized output exhibiting said predetermined frequency and further responsive to said sun generated indirect radiation within said select region of the spectrum to derive a d.c. characterized output of level corresponding with the intensity thereof;

detector circuit means responsive to said photoresponsive receiving means outputs for amplifying said binary characterized output while excluding said d.c. characterized output to provide an amplified binary characterized output exhibiting said predetermined frequency, said detector circuit means including an amplification stage having an input coupled with said photoresponsive receiving means and an output and having a gain defining first feedback path coupled between said output and input for predetermined amplification of said binary characterized output exhibiting said predetermined frequency, said amplification stage having a second feedback path coupled between said input and output and responsive substantially only to the generation of said d.c. characterized output for effecting the diversion thereof from said output; and demodulator means responsive to said amplified binary characterized output for deriving microprocessor compatible signals in correspondence therewith.

2. The apparatus of claim 1 in which:

said modulator means derives said binary signals by frequency shift keying between frequencies selected as about 24 Kilohertz and 40 Kilohertz; and said transmission rate is about 19.2 Kilobits per second.

3. The apparatus of claim 1 in which said second feedback path is configured to derive unity gain performance with respect to said d.c. characterized output.

4. The apparatus of claim 1 in which said second feedback path includes an optoisolator having a photoemitting component coupled with said amplification stage output.

5. The apparatus of claim 1 in which said photoresponsive receiving means includes a photodiode coupled with said amplification stage for performance in a photovoltaic mode in response to said impingement of radiation at said select region of the spectrum.

6. The apparatus of claim 1 in which said photoresponsive receiving means is a photodiode configured having an angle of radiation acceptance of about 10° measured from its optical axis to its half power point.

7. The apparatus of claim 1 further including indicator means responsive to the signal level of said detector circuit means amplified binary characterized output for providing a perceptible output representing said signal level, so as to optimize reception of said signal emissions by said photoresponsive receiving means by hand manipulation of said communicator.

8. Apparatus for carrying out communication between a meter having a forwardly disposed faceplate and a meter control circuit responsive to control inputs, and a hand maneuverable communicator having a communicator control circuit for providing meter control signals, said meter and communicator being locatable within an environment of direct and indirect sun generated radiation, comprising:

communicator transmitter means mounted with said communicator for transmitting said meter control signals, including:

modulator means responsive to said meter control signals for deriving binary signals corresponding therewith exhibiting predetermined frequency and transmission rate, and emitter means responsive to said binary signals for effecting transmission thereof as signal emissions exhibiting said predetermined frequency within a select region of the spectrum; and receiver means mounted with said meter, including:

photoresponsive receiving means responsive to the impingement of said signal emissions thereupon to derive a binary characterized output exhibiting said predetermined frequency and responsive to said sun generated indirect radiation within said select region of the spectrum to derive a d.c. characterized output of level corresponding with the intensity thereof, blocking means positioned adjacent said photoresponsive receiving means for substantially restricting the direct access of said impinging radiation to radiation from sources located below a horizontal plane extending from the vicinity of said photoresponsive receiving means;

detector circuit means responsive to said photoresponsive receiving means outputs for amplifying said binary characterized output while excluding said d.c. characterized output to provide an amplified binary characterized output exhibiting said predetermined frequency; and demodulator means responsive to said amplified binary characterized output for deriving said meter control inputs.

9. The apparatus of claim 8 which said photoresponsive receiving means is selected having an angle of radiation acceptance substantially larger than the beam angle of said emitter means.

10. The apparatus of claim 8 in which:

said select region of the spectrum is the infrared region; and said modulator means derives said binary signals by frequency shift keying between frequencies selected as about 90 KiloHertz and 150 KiloHertz.

11. Apparatus for carrying out communication between a meter having a forwardly disposed faceplate and a meter control circuit responsive to control inputs and further providing meter data as serial output signals, and a hand maneuverable communicator having a communicator control circuit for providing meter control signals and for recording received said meter data, said meter and communicator being locatable within an environment of direct and indirect sun generated radiation, comprising in combination:

meter transmitter means mounted with said meter for transmitting said meter data to said communicator at a predetermined data transmission rate including:

meter modulator means responsive to said serial output signals for deriving first binary, frequency shift keyed signals corresponding therewith at first and second frequencies, emitter means responsive to said first binary frequency shift keyed signals for effecting transmission thereof as first signal emissions within a select region of the spectrum;

communicator transmitter means mounted with said communicator for transmitting said meter control signals at a predetermined data transmission rate including:

communicator modulator means responsive to said communicator control circuit provided meter control signals for deriving second binary, frequency shift keyed signals corresponding therewith at third and fourth frequencies, and communicator emitter means responsive to said binary, frequency shift keyed signals for effecting transmission thereof as second signal emissions within a select region of the spectrum;

communicator receiver means mounted with said communicator including:

communicator photoresponsive receiving means responsive to the impingement of said first signal emissions to derive a first binary characterized output exhibiting said first and second frequencies, and responsive to said sun generated indirect radiation within said select region of the spectrum to derive a first d.c. characterized output of level corresponding with the intensity thereof, communicator detector circuit means responsive to said communicator photoresponsive receiving means outputs for amplifying said first binary characterized output while excluding said first d.c. characterized output to provide a first amplified binary characterized output exhibiting said first and second frequencies, and communicator modulator means responsive to said amplified first binary characterized output for deriving microprocessor compatible signals for effecting said recordation; and meter receiver means mounted with said meter, including:

meter photoresponsive receiving means responsive to the impingement of said second signal emissions to derive a second binary characterized output exhibiting said third and fourth frequencies, and responsive to said sun generated indirect radiation within said select region of the spectrum to derive a second d.c. characterized output of level corresponding with the intensity thereof, said meter photoresponsive receiving means including a photodiode mounted within said meter rearwardly of said forwardly disposed faceplate; said faceplate being configured having an opening aligned with said photodiode and shaped to substantially restrict the direct access of said impinging radiation to radiation from sources located below a horizontal plane extending from the topmost portion of said photodiode, meter detector circuit means responsive to said meter photoresponsive receiving means outputs for amplifying said second binary characterized output while excluding said second d.c. characterized output to provide a second amplified binary characterized output exhibiting said third and fourth frequencies, and meter demodulator means responsive to said second amplified binary characterized output for deriving said meter control inputs.

12. The apparatus of claim 11 in which:
said predetermined data transmission rate of said meter transmitter means and said communicator transmitter means is about 19.2 Kilobits per second;
said first and second frequencies are selected, respectively, as about 24 KHz and 40 KHz; and
said third and fourth frequencies are selected, respectively, as about 90 KHz and 150 KHz.

13. The apparatus of claim 11 in which:
the duty cycle for transmission of said first binary frequency shift keyed signals is 50%; and the duty cycle for transmission of said second binary frequency shift keyed signals is 25%.

14. The apparatus of claim 11 further including indicator means responsive to the signal level of said communicator detector circuit means amplified first binary characterized output for providing a perceptible output representing said signal level, so as to optimize reception of said signal emissions by said communication photoresponsive receiving means by hand manipulation of said communicator.

15. The apparatus of claim 11 in which said meter emitter means is selected having a beam angle substantially larger than the angle of radiation acceptance of said communicator photoresponsive receiving means.

16. The apparatus of claim 15 in which said meter emitter means beam angle is about 50° between half power points and said communicator photoresponsive receiving means acceptance angle measured from its optical axis to its half power point is about 10°.

17. Apparatus for carrying out communication between a meter having a forwardly disposed faceplate and a meter control circuit responsive to control inputs, and a hand maneuverable communicator having a communicator control circuit for providing meter control signals, said meter and communicator being locatable within an environment of direct and indirect sun generated radiation, comprising:

communicator transmitter means mounted with said communicator for transmitting said meter control signals, including:

modulator means responsive to said meter control signals for deriving binary signals corresponding therewith exhibiting predetermined frequency and transmission rate, and emitter means responsive to said binary signals for effecting transmission thereof as signal emissions exhibiting said predetermined frequency within a select region of the spectrum; and receiver means mounted with said meter, including:

photoresponsive receiving means responsive to the impingement of said signal emissions thereupon to derive a binary characterized output exhibiting said predetermined frequency and responsive to said sun generated indirect radiation within said select region of the spectrum to derive a d.c. characterized output of level corresponding with the intensity thereof, detector circuit means responsive to said photoresponsive receiving means outputs for amplifying said binary characterized output while excluding said d.c. characterized output to provide an amplified binary characterized output exhibiting said predetermined frequency, said detector circuit means including an amplification stage having an input coupled with said photoresponsive receiving means and an output and having a gain defining first feedback path coupled between said output and input for predetermined amplification of said binary characterized output exhibiting said predetermined frequency, said amplification stage having a second feedback path coupled between said input and output and responsive substantially only to the generation of said d.c. characterized output for effecting the diversion thereof from said output; and demodulator means responsive to said amplified binary characterized output for deriving said meter control inputs.

18. The apparatus of claim 17 in which said second feedback path is configured to derive unity gain performance with respect to said d.c. characterized output.

19. The apparatus of claim 17 in which said second feedback path includes an optoisolator having a photoemitting component coupled with said amplification stage output.

20. Apparatus for carrying out communication between a meter having a forwardly disposed faceplate and a meter control circuit responsive to control inputs, and a hand maneuverable communicator having a communicator control circuit for providing meter control signals, said meter and communicator being locatable within an environment of direct and indirect sun generated radiation, comprising:

communicator transmitter means mounted with said communicator for transmitting said meter control signals, including:

modulator means responsive to said meter control signals for deriving binary signals corresponding therewith exhibiting predetermined frequency and transmission rate, and emitter means responsive to said binary signals for effecting transmission thereof as signal emissions exhibiting said predetermined frequency within a select region of the spectrum; and receiver means mounted with said meter, including:

photoresponsive receiving means responsive to the impingement of said signal emissions thereupon to derive a binary characterized output exhibiting said predetermined frequency and responsive to said sun generated indirect radiation within said select region of the spectrum to derive a d.c. characterized output of level corresponding with the intensity thereof, said photoresponsive receiving means including a photodiode mounted within said meter rearwardly of said forwardly disposed faceplate; said faceplate being configured having an opening aligned with said photodiode and shaped to substantially restrict the direct access of said impinging radiation to radiation from sources located below a horizontal plane extending from the topmost portion of said photodiode, detector circuit means responsive to said photoresponsive receiving means outputs for amplifying said binary characterized output while excluding said d.c. characterized output to provide an amplified binary characterized output exhibiting said predeterminded frequency; and demodulator means responsive to said amplified binary characterized output for deriving said meter control inputs.

21. Apparatus for carrying out communication between a meter having a forwardly disposed faceplate and a meter control circuit responsive to control inputs and further providing meter data as serial output signals, and a hand maneuverable communicator having a communicator control circuit for providing meter control signals and for recording received said meter data, said meter and communicator being locatable within an environment of direct and indirect sun generated radiation, comprising in combination:

meter transmitter means mounted with said meter for transmitting said meter data to said communicator at a predetermined data transmission rate including:

meter modulator means responsive to said serial output signals for deriving first binary, frequency shift keyed signals corresponding therewith at first and second frequencies, emitter means responsive to said first binary frequency shift keyed signals for effecting transmission thereof as first signal emissions within a select region of the spectrum;

communicator transmitter means mounted with said communicator for transmitting said meter control signals at a predetermined data transmission rate including:

communicator modulator means responsive to said communicator control circuit provided meter control signals for deriving second binary, frequency shift keyed signals corresponding therewith at third and fourth frequencies, and communicator emitter means responsive to said binary, frequency shift keyed signals for effecting transmission thereof as second signal emissions within a select region of the spectrum;

communicator receiver means mounted with said communicator including:

communicator photoresponsive receiving means responsive to the impingement of said first signal emissions to derive a first binary characterized output exhibiting said first and second frequencies, and responsive to said sun generated indirect radiation within said select region of the spectrum to derive a first d.c. characterized output of level corresponding with the intensity thereof, communicator detector circuit means responsive to said communicator photoresponsive receiving means outputs for amplifying said first binary characterized output while excluding said first d.c. characterized output to provide a first amplified binary characterized output exhibiting said first and second frequencies, and communicator modulator means responsive to said amplified first binary characterized output for deriving microprocessor compatible signals for effecting said recordation; and meter receiver means mounted with said meter, including:

meter photoresponsive receiving means responsive to the impingement of said second signal emissions to derive a second binary characterized output exhibiting said third and fourth frequencies, and responsive to said sun generated indirect radiation within said select region of the spectrum to derive a second d.c. characterized output of level corresponding with the intensity thereof, blocking means positioned adjacent said meter photoresponsive receiving means for substantially restricting the direct access of said impinging radiation to radiation from sources located below a horizontal plane extending from the vicinity of said meter photoresponsive receiving means;

meter detector circuit means responsive to said meter photoresponsive receiving means outputs for amplifying said second binary characterized output while excluding said second d.c. characterized output to provide a second amplified binary characterized output exhibiting said third and fourth frequencies, and meter demodulator means responsive to said second amplified binary characterized output for deriving said meter control inputs.

22. The apparatus of claim 21 in which:

said meter photoresponsive receiving means is selected having an angle of radiation acceptance substantially larger than the beam angle of said communicator emitter means.

23. The apparatus of claim 22 in which the half angle of radiation acceptance of said meter photoresponsive receiving means measured from its optical axis to half power point is about 30°; and the beam angle between half power points of said communicator emitter means is about 18°.

24. Apparatus for carrying out communication between a meter having a forwardly disposed faceplate and a meter control circuit responsive to control inputs and further providing meter data as serial output signals, and a hand maneuverable communicator having a communicator control circuit for providing meter control signals and for recording received said meter data, said meter and communicator being locatable within an environment of direct and indirect sun generated radiation, comprising in combination:

meter transmitter means mounted with said meter for transmitting said meter data to said communicator at a predetermined data transmission rate including:

meter modulator means responsive to said serial output signals for deriving first binary, frequency shift keyed signals corresponding therewith at first and second frequencies, emitter means responsive to said first binary frequency shift keyed signals for effecting transmission thereof as first signal emissions within a select region of the spectrum;

communicator transmitter means mounted with said communicator for transmitting said meter control signals at a predetermined data transmission rate including:

communicator modulator means responsive to said communicator control circuit provided meter control signals for deriving second binary, frequency shift keyed signals corresponding therewith at third and fourth frequencies, and communicator emitter means responsive to said binary, frequency shift keyed signals for effecting transmission thereof as second signal emissions within a select region of the spectrum;

communicator receiver means mounted with said communicator including:

communicator photoresponsive receiving means responsive to the impingement of said first signal emissions to derive a first binary characterized output exhibiting said first and second frequencies, and responsive to said sun generated indirect radiation within said select region of the spectrum to derive a first d.c. characterized output of level corresponding with the intensity thereof, communicator filter means for excluding signals exhibiting said third and fourth frequencies from said first amplified binary characterized output, communicator detector circuit means responsive to said communicator photoresponsive receiving means outputs for amplifying said first binary characterized output while excluding said first d.c. characterized output to provide a first amplified binary characterized output exhibiting said first and second frequencies, and communicator modulator means responsive to said amplified first binary characterized output for deriving microprocessor compatible signals for effecting said recordation; and meter receiver means mounted with said meter, including:

meter photoresponsive receiving means responsive to the impingement of said second signal emissions to derive a second binary characterized output exhibiting said third and fourth frequencies, and responsive to said sun generated indirect radiation within said select region of the spectrum to derive a second d.c. characterized output of level corresponding with the intensity thereof, communicator filter means for excluding signals exhibiting said third and fourth frequencies from said first amplified binary characterized output;

meter detector circuit means responsive to said meter photoresponsive receiving means outputs for amplifying said second binary characterized output while excluding said second d.c. characterized output to provide a second amplified binary characterized output exhibiting said third and fourth frequencies, and meter demodulator means responsive to said second amplified binary characterized output for deriving said meter control inputs.

25. Apparatus for carrying out communication between a meter having a forwardly disposed faceplate and a meter control circuit responsive to control inputs and further providing meter data as serial output signals, and a hand maneuverable communicator having a communicator control circuit for providing meter control signals and for recording received said meter data, said meter and communicator being locatable within an environment of direct and indirect sun generated radiation, comprising in combination:

meter transmitter means mounted with said meter for transmitting said meter data to said communicator at a predetermined data transmission rate including:

meter modulator means responsive to said serial output signals for deriving first binary, frequency shift keyed signals corresponding therewith at first and second frequencies, emitter means responsive to said first binary frequency shift keyed signals for effecting transmission thereof as first signal emissions within a select region of the spectrum;

communicator transmitter means mounted with said communicator for transmitting said meter control signals at a predetermined data transmission rate including:

communicator modulator means responsive to said communicator control circuit provided meter control signals for deriving second binary, frequency shift keyed signals corresponding therewith at third and fourth frequencies, and communicator emitter means responsive to said binary, frequency shift keyed signals for effecting transmission thereof as second signal emissions within a select region of the spectrum;

communicator receiver means mounted with said communicator including:

communicator photoresponsive receiving means responsive to the impingement of said first signal emissions to derive a first binary characterized output exhibiting said first and second frequencies, and responsive to said sun generated indirect radiation within said select region of the spectrum to derive a first d.c. characterized output of level corresponding with the intensity thereof, communicator detector circuit means responsive to said communicator photoresponsive receiving means outputs for amplifying said first binary characterized output while excluding said first d.c. characterized output to provide a first amplified binary characterized output exhibiting said first and second frequencies, and communicator modulator means responsive to said amplified first binary characterized output for deriving microprocessor compatible signals for effecting said recordation; and meter receiver means mounted with said meter, including:

meter photoresponsive receiving means responsive to the impingement of said second signal emissions to derive a second binary characterized output exhibiting said third and fourth frequencies, and responsive to said sun generated indirect radiation within said select region of the spectrum to derive a second d.c. characterized output of level corresponding with the intensity thereof, meter filter means for excluding signals exhibiting said first and second frequencies from said second amplified binary characterized output, meter detector circuit means responsive to said meter photoresponsive receiving means outputs for amplifying said second binary characterized output while excluding said second d.c. characterized output to provide a second amplified binary characterized output exhibiting said third and fourth frequencies, and meter demodulator means responsive to said second amplified binary characterized output for deriving said meter control inputs.

26. Apparatus for carrying out communication between a meter having a forwardly disposed faceplate and a meter control circuit responsive to control inputs and further providing meter data as serial output signals, and a hand maneuverable communicator having a communicator control circuit for providing meter control signals and for recording received said meter data, said meter and communicator being locatable within an environment of direct and indirect sun generated radiation, comprising in combination:

meter transmitter means mounted with said meter for transmitting said meter data to said communicator at a predetermined data transmission rate including:

meter modulator means responsive to said serial output signals for deriving first binary, frequency shift keyed signals corresponding therewith at first and second frequencies, emitter means responsive to said first binary frequency shift keyed signals for effecting transmission thereof as first signal emissions within a select region of the spectrum;

communicator transmitter means mounted with said communicator for transmitting said meter control signals at a predetermined data transmission rate including:

communicator modulator means responsive to said communicator control circuit provided meter control signals for deriving second binary, frequency shift keyed signals corresponding therewith at third and fourth frequencies, and communicator emitter means responsive to said binary, frequency shift keyed signals for effecting transmission thereof as second signal emissions within a select region of the spectrum;

communicator receiver means mounted with said communicator including:

communicator photoresponsive receiving means responsive to the impingement of said first signal emissions to derive a first binary characterized output exhibiting said first and second frequencies, and responsive to said sun generated indirect radiation within said select region of the spectrum to derive a first d.c. characterized output of level corresponding with the intensity thereof, communicator detector circuit means responsive to said communicator photoresponsive receiving means outputs for amplifying said first binary characterized output while excluding said first d.c. characterized output to provide a first amplified binary characterized output exhibiting said first and second frequencies, said communicator detector circuit means including a communicator amplification stage having an input coupled with said communicator photoresponsive receiving means and an output and having a gain defining first feedback path coupled between said input and output for predetermined amplification of said first binary characterized output, said communicator amplification stage having a second feedback path coupled between said input and output and responsive substantially only to the generation of said first d.c. characterized output for effecting the diversion thereof, and communicator modulator means responsive to said amplified first binary characterized output for deriving microprocessor compatible signals for effecting said recordation; and meter receiver means mounted with said meter, including:

meter photoresponsive receiving means responsive to the impingement of said second signal emissions to derive a second binary characterized output exhibiting said third and fourth frequencies, and responsive to said sun generated indirect radiation within said select region of the spectrum to derive a second d.c. characterized output of level corresponding with the intensity thereof, meter detector circuit means responsive to said meter photoresponsive receiving means outputs for amplifying said second binary characterized output while excluding said second d.c. characterized output to provide a second amplified binary characterized output exhibiting said third and fourth frequencies, and meter demodulator means responsive to said second amplified binary characterized output for deriving said meter control inputs.

27. Apparatus for carrying out communication between a meter having a forwardly disposed faceplate and a meter control circuit responsive to control inputs and further providing meter data as serial output signals, and a hand maneuverable communicator having a communicator control circuit for providing meter control signals and for recording received said meter data, said meter and communicator being locatable within an environment of direct and indirect sun generated radiation, comprising in combination:

meter transmitter means mounted with said meter for transmitting said meter data to said communicator at a predetermined data transmission rate including:

meter modulator means responsive to said serial output signals for deriving first binary, frequency shift keyed signals corresponding therewith at first and second frequencies, emitter means responsive to said first binary frequency shift keyed signals for effecting transmission thereof as first signal emissions within a select region of the spectrum;

communicator transmitter means mounted with said communicator for transmitting said meter control signals at a predetermined data transmission rate including:

communicator modulator means responsive to said communicator contol circuit provided meter control signals for deriving second binary, frequency shift keyed signals corresponding therewith at third and fourth frequencies, and communicator emitter means responsive to said binary, frequency shift keyed signals for effecting transmission thereof as second signal emissions within a select region of the spectrum;

communicator receiver means mounted with said communicator including:

communicator photoresponsive receiving means responsive to the impingement of said first signal emissions to derive a first binary characterized output exhibiting said first and second frequencies, and responsive to said sun generated indirect radiation within said select region of the spectrum to derive a first d.c. characterized output of level corresponding with the intensity thereof, communicator detector circuit means responsive to said communicator photoresponsive receiving means outputs for amplifying said first binary characterized output while excluding said first d.c. characterized output to provide a first amplified binary characterized output exhibiting said first and second frequencies, and communicator modulator means responsive to said amplified first binary characterized output for deriving microprocessor compatible signals for effecting said recordation; and meter receiver means mounted with said meter, including:

meter photoresponsive receiving means responsive to the impingement of said second signal emissions to derive a second binary characterized output exhibiting said third and fourth frequencies, and responsive to said sun generated indirect radiation within said select region of the spectrum to derive a second d.c. characterized output of level corresponding with the intensity thereof, meter detector circuit means responsive to said meter photoresponsive receiving means outputs for amplifying said second binary characterized output while excluding said second d.c. characterized output to provide a second amplified binary characterized output exhibiting said third and fourth frequencies, said meter detector circuit means comprising a meter amplification stage having an input coupled with said meter photoresponsive receiving means and an output and having a gain defining first feedback path coupled between said input and output for predetermined amplification of said second binary characterized output, said meter amplification stage having a second feedback path coupled between said input and said output and responsive substantially only to the generation of said second d.c. characterized output for effecting the diversion thereof; and meter demodulator means responsive to said second amplified binary characterized output for deriving said meter control inputs.

* * * * *

UNITED STATES PATENT AND TRADEMARK OFFICE
CERTIFICATE OF CORRECTION

PATENT NO. : 4,868,893

DATED : September 19, 1989

INVENTOR(S) : Scott H. Hammond

It is certified that error appears in the above-identified patent and that said Letters Patent is hereby corrected as shown below:

On the title page, item [54] and in column 1, line 3:

The title of the patent is printed "SYSTEM FOR REMOTE INTERACTIVE COMMUNICATION WITH A METAL UNDER AMBIENT SUNLIGHT CONDITIONS"

The title of the patent should read --SYSTEM FOR REMOTE INTERACTIVE COMMUNICATION WITH A METER UNDER AMBIENT SUNLIGHT CONDITIONS--

Signed and Sealed this

Twenty-third Day of July, 1991

Attest:

HARRY F. MANBECK, JR.

*Attesting Officer*      *Commissioner of Patents and Trademarks*